United States Patent
Nakamura et al.

(10) Patent No.: US 9,123,717 B2
(45) Date of Patent: Sep. 1, 2015

(54) SEMICONDUCTOR DEVICE MANUFACTURING METHOD AND MANUFACTURING APPARATUS

(71) Applicant: KABUSHIKI KAISHA TOSHIBA, Minato-Ku, Tokyo (JP)

(72) Inventors: Kenro Nakamura, Oita (JP); Mitsuyoshi Endo, Yamato (JP); Kazuyuki Higashi, Oita (JP); Takashi Shirono, Oita (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 13/954,833

(22) Filed: Jul. 30, 2013

(65) Prior Publication Data

US 2014/0242779 A1    Aug. 28, 2014

(30) Foreign Application Priority Data

Feb. 28, 2013  (JP) ................. 2013-039025

(51) Int. Cl.
*H01L 21/30* (2006.01)
*H01L 21/46* (2006.01)
(Continued)

(52) U.S. Cl.
CPC .............. *H01L 25/50* (2013.01); *H01L 21/561* (2013.01); *H01L 21/6715* (2013.01); *H01L 21/67092* (2013.01); *H01L 23/3178* (2013.01); *H01L 23/3185* (2013.01); *H01L 24/94* (2013.01); *H01L 21/6836* (2013.01); *H01L 24/80* (2013.01); *H01L 24/83* (2013.01); *H01L 2221/68327* (2013.01); *H01L 2224/08146* (2013.01); *H01L 2224/2919* (2013.01); *H01L 2224/32145* (2013.01); *H01L 2224/75744* (2013.01); *H01L 2224/80006* (2013.01); *H01L 2224/80123* (2013.01); *H01L 2224/80129* (2013.01); *H01L 2224/83005* (2013.01);
(Continued)

(58) Field of Classification Search
CPC .................................................. H01L 21/6715
USPC ........................................................ 438/459
See application file for complete search history.

(56) References Cited

U.S. PATENT DOCUMENTS 6,958,298 B2   10/2005   Murayama
2002/0164876 A1*  11/2002   Walitzki et al. ............... 438/692
(Continued)

FOREIGN PATENT DOCUMENTS

JP    11-067701 A    3/1999
JP    2004241434 A   8/2004
(Continued)

OTHER PUBLICATIONS

Japanese Office Action (and English translation thereof) dated Apr. 17, 2015, issued in counterpart Japanese Application No. 2013-039025.

*Primary Examiner* — Matthew Landau
*Assistant Examiner* — Igwe U Anya
(74) *Attorney, Agent, or Firm* — Holtz, Holtz, Goodman & Chick PC

(57) ABSTRACT

According to one embodiment, a semiconductor device manufacturing method includes: bonding a first wafer and a second wafer to each other, to form a stack; rubbing a film attached with a fill material in a thin-film shape into a gap located between a bevel of the first wafer and a bevel of the second wafer, to fill the gap with the fill material; and thinning the first wafer.

6 Claims, 10 Drawing Sheets

(51) Int. Cl.
*H01L 25/00* (2006.01)
*H01L 21/67* (2006.01)
*H01L 23/31* (2006.01)
*H01L 21/56* (2006.01)
*H01L 23/00* (2006.01)
*H01L 21/683* (2006.01)

(52) U.S. Cl.
CPC ............... *H01L 2224/83123* (2013.01); *H01L 2224/83129* (2013.01); *H01L 2224/94* (2013.01); *H01L 2225/06541* (2013.01)

(56) References Cited

U.S. PATENT DOCUMENTS

| | | | |
|---|---|---|---|
| 2002/0197770 A1* | 12/2002 | Irie | 438/114 |
| 2004/0137697 A1 | 7/2004 | Tomita | |
| 2004/0185751 A1 | 9/2004 | Nakanishi et al. | |
| 2004/0242003 A1 | 12/2004 | Murayama | |
| 2006/0278991 A1* | 12/2006 | Kwon et al. | 257/777 |
| 2007/0045836 A1* | 3/2007 | Kwon et al. | 257/734 |
| 2008/0179612 A1* | 7/2008 | Shin | 257/98 |
| 2008/0268614 A1* | 10/2008 | Yang et al. | 438/455 |
| 2008/0318363 A1* | 12/2008 | Kwon et al. | 438/113 |
| 2010/0230707 A1* | 9/2010 | Shin | 257/98 |
| 2011/0091685 A1 | 4/2011 | Farooq et al. | |
| 2012/0308817 A1* | 12/2012 | Ponsolle et al. | 428/365 |

FOREIGN PATENT DOCUMENTS

| | | |
|---|---|---|
| JP | 2004349649 A | 12/2004 |
| JP | 2008-091951 A | 4/2008 |

* cited by examiner

SEMICONDUCTOR DEVICE MANUFACTURING METHOD AND MANUFACTURING APPARATUS

CROSS-REFERENCE TO RELATED APPLICATION

This application is based upon and claims the benefit of priority from prior Japanese Patent Application No. 2013-39025, filed on Feb. 28, 2013, the entire contents of which are incorporated herein by reference.

FIELD

Embodiments of the present invention relate to a semiconductor device manufacturing method and a manufacturing apparatus.

BACKGROUND

In recent years, it has come to be realized that there are limits on setting of finer semiconductor design rules, and it has thus been difficult to increase the number of devices in a semiconductor device to make it denser by means of the finer design rules. For this reason, as a new approach to a higher density other than the setting of finer design rules, a three-dimensional mounting technique for semiconductor chips has come under the spotlight. This three-dimensional mounting will be briefly described as follows. It corresponds to "separating two-dimensionally horizontally extended semiconductor devices into groups in accordance with respective functions, and vertically stacking those". That is, the idea is that the number of devices per unit area is increased by the three-dimensional mounting.

As the three-dimensional mounting, for example, a wire bonding system has come along in which semiconductor chips are stacked and connected to one another by wire bonding. This has brought about a higher density to a certain degree as compared with the conventional two-dimensional semiconductor devices. However, making a thickness of each semiconductor chip not larger than 50 µm is difficult, and further, a bonding mechanism layer (underfill layer) with a thickness of the order of 20 µm is interposed between the semiconductor chips. Hence, also from the viewpoint of a three-dimensional arrangement with respect to processes in the wire bonding, the number of stackable semiconductor chips is limited to the order of 16. Moreover, since the wire that connects the semiconductor chips has an extremely long wiring length, it is disadvantageous to speeding up of the semiconductor device.

Under such circumstances, three-dimensional mounting in a TSV system is recently drawing attention. A TSV is an abbreviation of a through-silicon via, and refers to a through-silicon electrode. In the TSV system, this TSV serves as a connection wire between semiconductor chips. Therefore, the wiring length for connection between the semiconductor chips is significantly small as compared with the wiring length of the wire in the wire bonding system described above. This can reduce a resistance component, a capacitance component and a reactance component of the wire that connects the semiconductor chips, and hence in the TSV system, a signal is resistant to attenuation even when being a high-frequency signal, and hence it is advantageous to speeding up of the semiconductor device.

In the TSV system, the stacked semiconductor chips are bonded to each other in the form of also being electrically connected to each other. Formation of a stacked module by means of the three-dimensional mounting in the TSV system is broadly divided as follows.

(1) A wafer (e.g., silicon wafer) is individually separated (divided) in advance to form a plurality of dice (semiconductor chips), and the dice are bonded to each other to be three-dimensionally mounted, to form stacked modules.

(2) A plurality of wafers are bonded to one another until the number of layers of the wafer stacked reaches an eventual number, to form a wafer stack, which is finally individually separated to form stacked modules.

Currently, (1) is generally performed, and costly advantageous (2) is said to be generally performed in the future. Performing (2) requires a stable, tough wafer stack, in the periphery of which a wafer is not peeled off.

DETAILED DESCRIPTION

In one embodiment, a semiconductor device manufacturing method includes: bonding a first wafer and a second wafer to each other, to form a stack; rubbing a film attached with a fill material in a thin-film shape into a gap located between a bevel of the first wafer and a bevel of the second wafer, to fill the gap with the fill material; and thinning the first wafer.

Hereinafter, embodiments will be described with reference to the drawings. However, the present invention is not limited to these embodiments. It is to be noted that a portion in common throughout the drawings is provided with a common numeral, and a repeated description thereof will be omitted. Further, the drawings are schematic views for explaining the invention and promoting understanding thereof, and some places may have shapes, sizes, ratios or the like different from those in an actual device, but these can be appropriately subjected to design changes in light of the following descriptions and known techniques.

However, an expression such as "flat", "almost flat", "right-angled", "almost right-angled", "horizontal" or "almost horizontal" used for a shape and a position of a plane and an angle of an edge, or an expression of a shape in the following description does not only mean a case where it is mathematically (geometrically) flat, right-angled or horizontal or a case where it is mechanically defined, but also means a case where it is different or rough to an industrially allowable degree in a manufacturing process of a semiconductor device or it has a shape belonging to the above shape.

Figure 1:
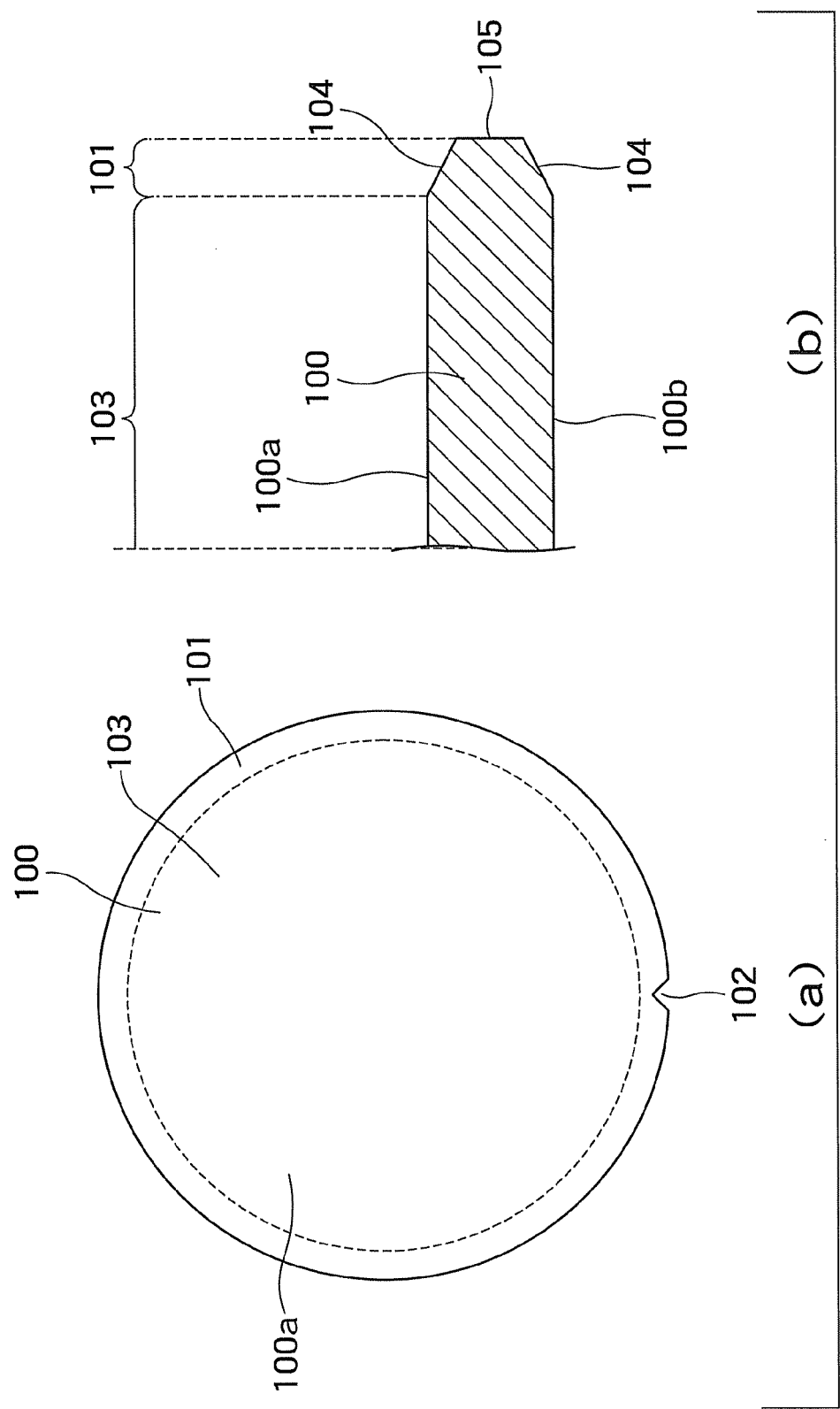
FIG. 1 is a view for explaining each region of a wafer.

A wafer such as a silicon wafer will be treated in the present embodiment, each region of a general wafer will be described using FIGS. 1 (a) and 1 (b) in advance of explanation of the present embodiment. FIG. 1 (a) is a plan view of a front surface 100a of a wafer 100, seen from above. FIG. 1 (b) is a sectional view of the wafer 100 in a peripheral portion 101 of the wafer 100 and in its vicinity. As shown in FIG. 1 (a), the front surface 100a of the wafer 100 has a central portion 103 extending in the center of the wafer 100, and the peripheral portion 101 located on the periphery of the central portion. Moreover, the wafer 100 is provided with a notch, referred to as a notch 102, in part of the periphery of the wafer 100 for the purpose of facilitating discrimination of the wafers 100 in a crystal direction and alignment of the wafers 100. Then, the front surface 100a of the wafer 100 is almost flat in the central portion 103, as shown in FIG. 1 (b). In the peripheral portion 101, the front surface 100a is continuing to an end surface 105 of the periphery of the wafer 100 while being inclined. By performing a beveling process to form the cross section of the peripheral portion 101 of the wafer 100 into such a shape, the strength of the peripheral portion 101 of the wafer 100 is ensured. The plane inclined in the peripheral portion 101 is referred to as a bevel 104. It is to be noted that a rear surface 100b of the wafer 100 which is located on the opposite side to the front surface 100a has a similar configuration to that of the front surface 100a.

First Embodiment

A method for manufacturing a wafer stack 23 according to the present embodiment will be described using FIGS. 2A to 2F. FIGS. 2A to 2F are sectional views of the wafer stack 23 in a peripheral portion of the wafer stack 23 and in its vicinity in respective processes of the manufacturing method of the present embodiment.

Figure 2A:
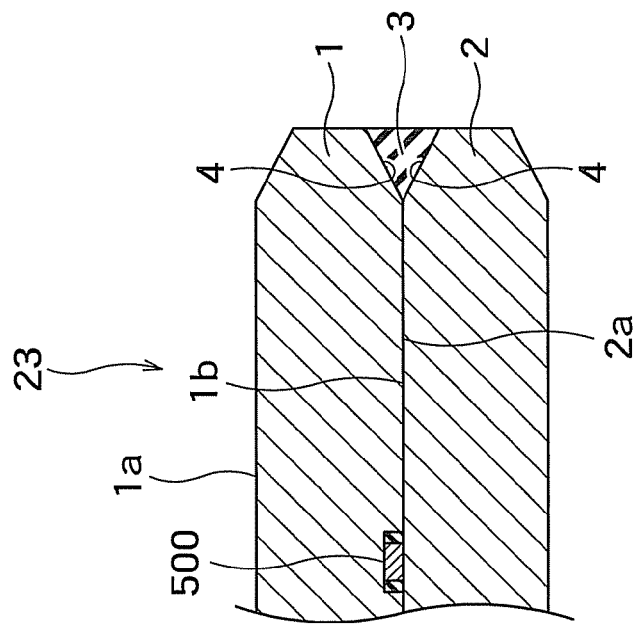
FIGS. 2A to 2F are views for explaining a semiconductor device manufacturing method according to the present embodiment.

First, a first wafer 1 formed with semiconductor devices and the like and a second wafer 2 for grinding support are prepared. It is to be noted that in the first wafer 1, a through electrode 500 passing through the first wafer 1 may be formed in advance, or may be formed after grinding/polishing of the first wafer 1. The second wafer 2 may also be formed in advance similarly to the above as necessary. As shown in FIG. 2A, the first wafer 1 and the second wafer 2 are aligned such that the front surface 1b of the first wafer 1 as a device surface formed with an electrode and the like and a front surface 2a of the second wafer 2 are opposed to each other, and the centers and the notches of the first wafer 1 and the second wafer 2 are superimposed on each other. In order to keep the aligned state, the first wafer 1 and the second wafer 2 are bonded to each other by an adhesive method, a fusion bonding method or the like, to form the wafer stack 23. It is to be noted that the second wafer 2 for grinding support can not only play a function to support the first wafer 1 at the time of grinding/polishing the first wafer 1, but also play a device function in the wafer stack 23 by formation of an electrode and the like on the front surface 2a of the second wafer 2 before the bonding. In this case, the second wafer 2 is not peeled off the first wafer 1, and left in the eventually formed wafer stack 23. On the other hand, when the second wafer 2 is only to play the function of grinding support, the second wafer 2 may be eventually peeled off the first wafer 1.

Figure 2B:
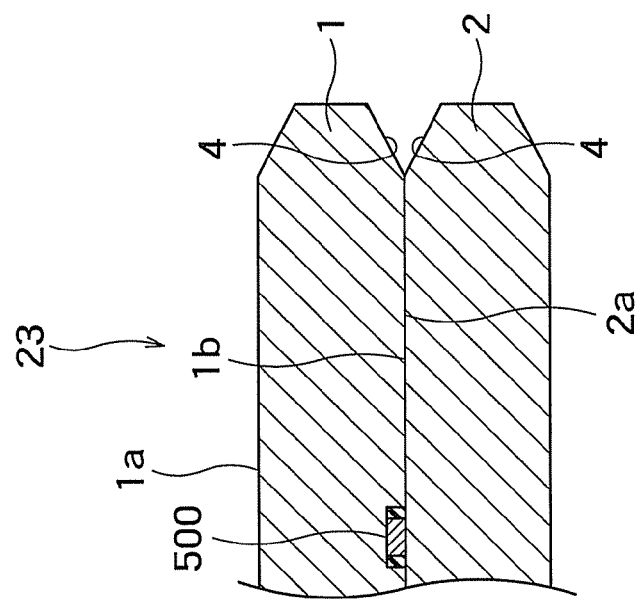
Figure 2C:
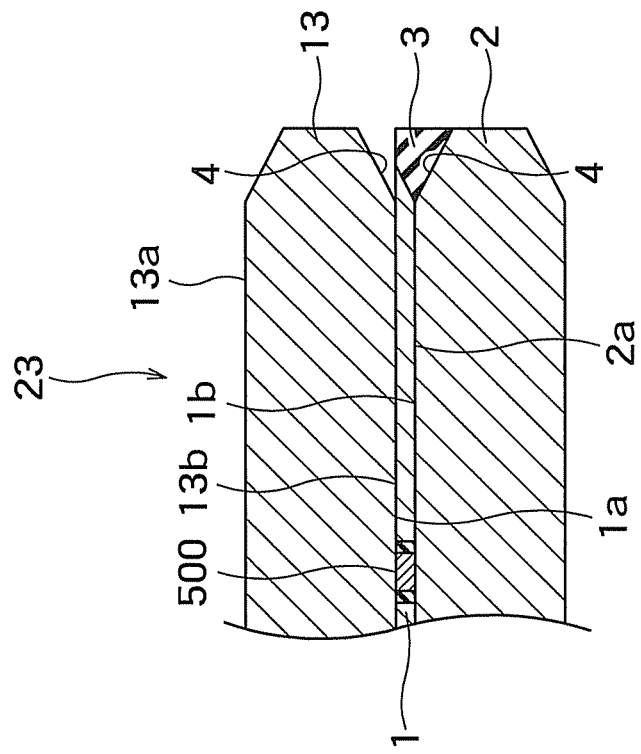

Subsequently, as shown in FIG. 2B, a circuit of a gap located between a bevel 4 of the first wafer 1 and a bevel 4 of the second wafer 2 is filled with a fill material 3 along the periphery of the wafer stack 23. Hereinafter, the filling with the fill material 3 will specifically be described.

First, the fill material 3 is formed into a thin-film shape with a thickness of the order of 300 μm, which is attached to a tape-shaped film 22, to form a fill material-attached tape (film) 24. The fill material 3 will specifically be described later.

Figure 3:
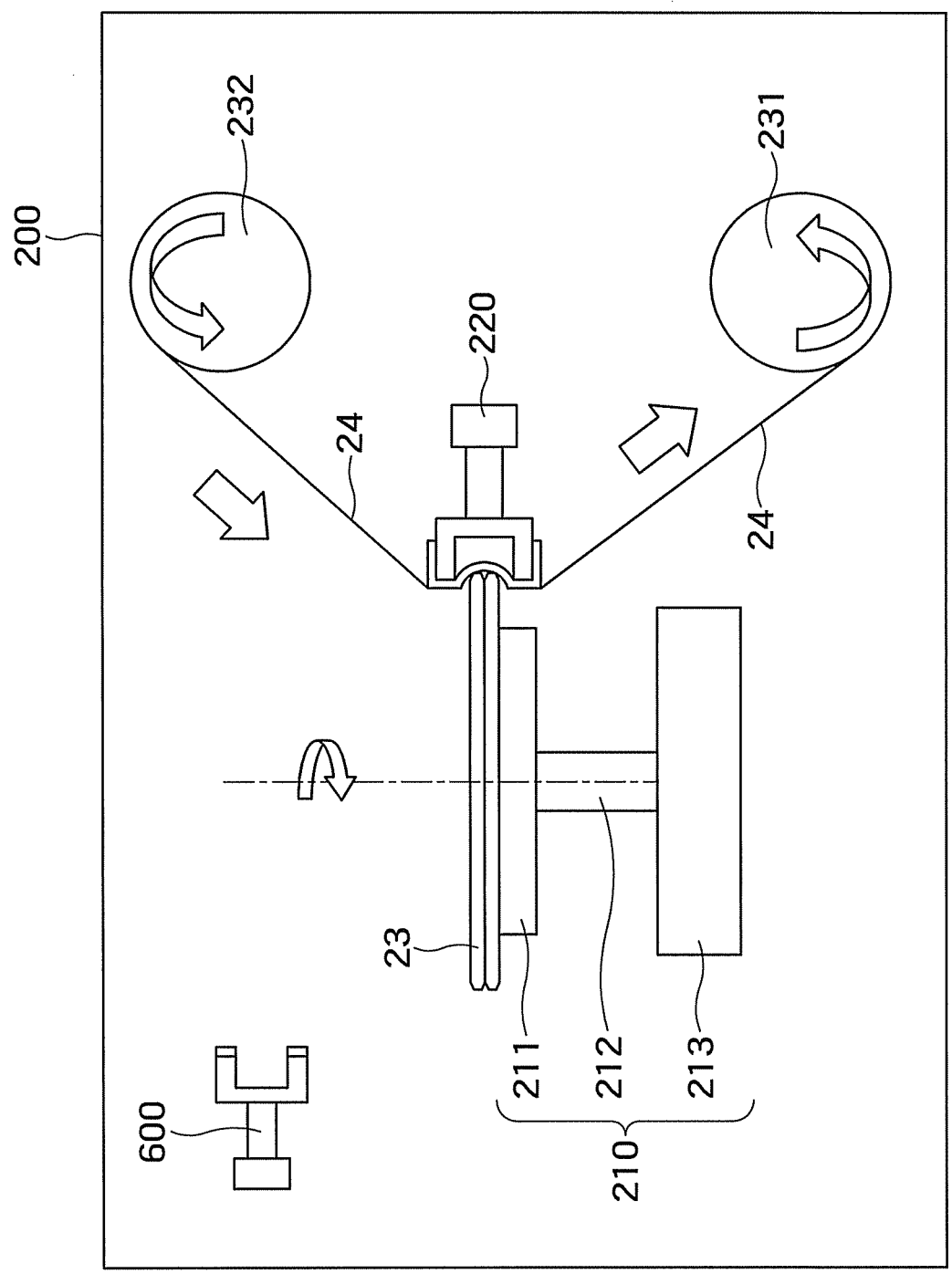
FIG. 3 is a side view of a semiconductor manufacturing apparatus according to a first embodiment.

Next, FIG. 3 shows a side view of a semiconductor manufacturing apparatus 200 which is used at the time of filling with the fill material 3. This semiconductor manufacturing apparatus 200 has a holding portion (rotating unit) 210 that holds the wafer stack 23, and a rubbing head 220 that rubs the fill material-attached tape 24 into the gap in the peripheral portion of the wafer stack 23. Further, it has a take-up reel 231 and a supply reel 232 for supplying the fill material-attached tape 24 and taking it up while applying predetermined tensile force to the fill material-attached tape 24.

The holding portion 210 has a holding table 211 that vacuum-adsorbs the wafer stack 23 to hold the wafer stack 23, a support shaft 212 that supports the holding table 211, and a motor 213 for rotating the support shaft 212. A lower end of this support shaft 212 is connected to the motor 213, and the support shaft 212 and the holding table 211 are rotated in an integrated manner by the motor 213. For example, the holding table 211 rotates around the support shaft 212 as a rotating shaft, while the plane of the holding table 211 that holds the wafer stack 23 is kept in such a state as to be horizontal to the ground.

Figure 4:
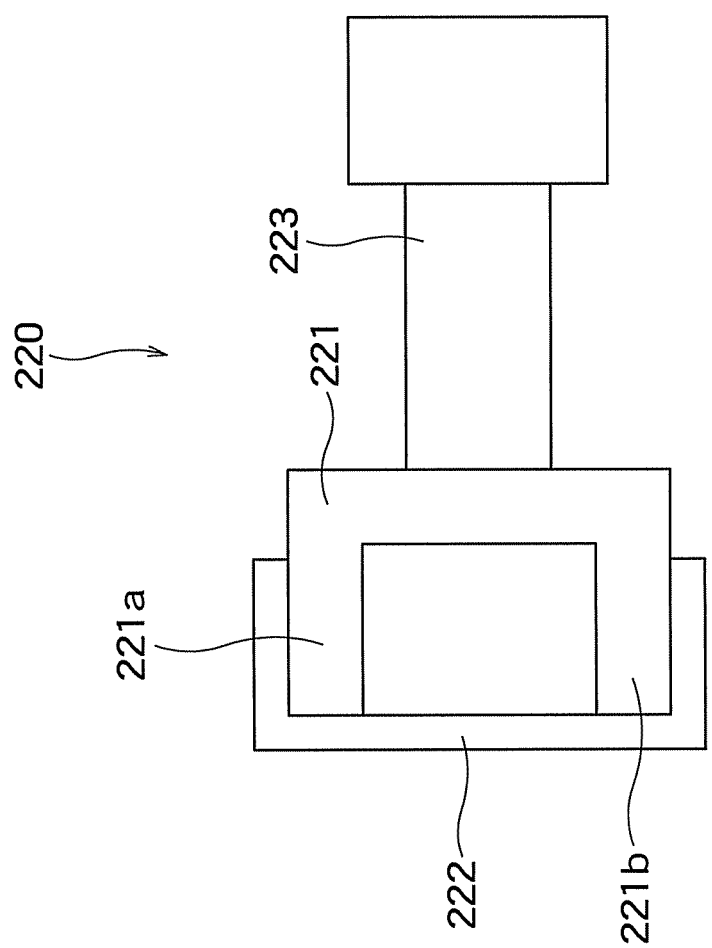
FIG. 4 is a side view of a rubbing head according to the first embodiment.

FIG. 4 is a side view of the rubbing head 220. The rubbing head 220 has a support portion 221 having two protruding portions 221a and 221b, an elastic member 222 which is made of elastic rubber and the like, tightly stretched between the protruding portions 221a and 221b, and an air cylinder 223 connected to the support portion 221. Using this air cylinder 223, the rubbing head 220 is shifted to the optimal position.

It is to be noted that in a mechanism of a beveling polishing unit used at the time of polishing the end surface of a wafer in the conventional semiconductor device manufacturing process, a polishing tape can be replaced by the fill material-attached tape 24, so as to use the beveling polishing unit as the semiconductor manufacturing apparatus 200 according to the present embodiment.

In the semiconductor manufacturing apparatus 200 as described above, the wafer stack 23 is held on the holding table 211. At this time, the wafer stack 23 is arranged on the holding table 211 such that the centers of the first wafer 1 and the second wafer 2 in the wafer stack 23 are superimposed on the center of the support shaft 212. The fill material-attached tape 24 is fixed such that its plane on the film 22 side comes into contact with the elastic member 222. Then, the air cylinder 223 is driven to shift the rubbing head 220 such that the peripheral portion of the wafer stack 23 is placed between the two protruding portions 221a and 221b, and the periphery of the wafer stack 23 is connected to the elastic member 222 via the fill material-attached tape 24. Subsequently, the wafer stack 23 is rotated at a constant speed by use of the holding portion 210. Further, the take-up reel 231 and the supply reel 232 are rotated at a constant speed to supply and take up the fill material-attached tape 24, while applying constant tensile force to the fill material-attached tape 24 (cf. FIG. 3).

Figure 5:
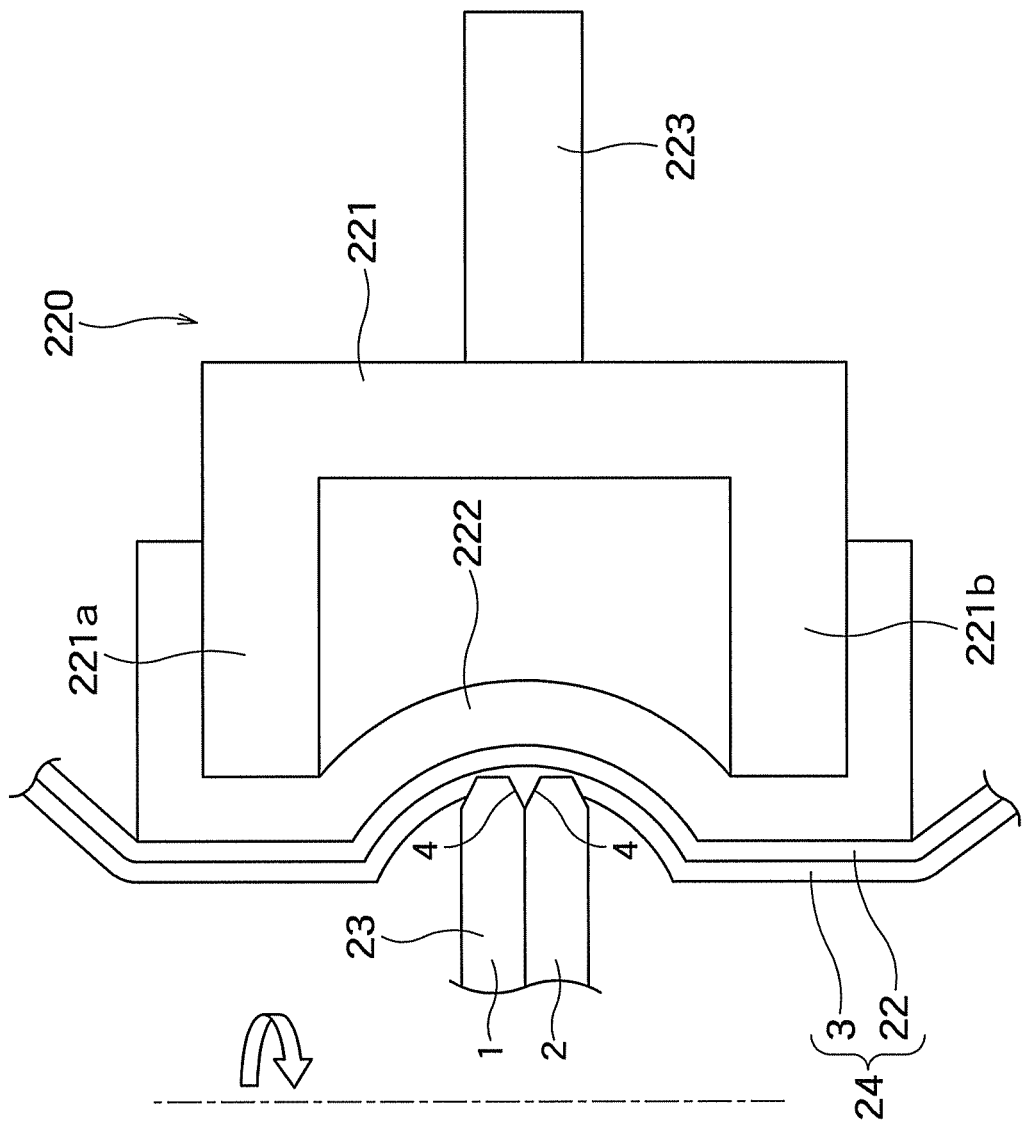
FIG. 5 is a view for explaining a manufacturing process using a semiconductor manufacturing apparatus of the first embodiment.

More specifically, as shown in FIG. 5 as an enlarged side view of the vicinity of the rubbing head 220 in FIG. 3, the fill material-attached tape 24 is pressed against the periphery of the wafer stack 23 by the elastic member 222 tightly stretched between the protruding portions 221a and 221b. At this time, the elastic member 222 pressed against the periphery of the wafer stack 23 via the fill material-attached tape 24 is stretched, and the elastic member 222 thus generates tensile force. By the tensile force of the elastic member 222, constant force is applied to the periphery of the wafer stack 23 via the fill material-attached tape 24, and the fill material 3 of the fill material-attached tape 24 is rubbed into the gap located between the bevel 4 of the first wafer 1 and the bevel 4 of the second wafer 2. Since the take-up reel 231 and the supply reel 232 are rotated at a constant speed, a new surface of the fill material-attached tape 24 is constantly pressed against the gap, and moreover, since the wafer stack 23 is rotated at a constant speed, the fill material 3 can be rubbed along the periphery of the wafer stack 23.

After the gap has been filled with the fill material 3, a drying treatment, a heating treatment or a light irradiation treatment is performed as necessary, to cure the fill material 3. As the means for curing the fill material 3, the optimal one is selected in accordance with a material for the fill material 3.

Moreover, in order to form a shape of the fill material 3 and prevent the wafer stack 23 from being contaminated by the residual fill material 3, it is preferable that, after curing of the fill material 3, the residual fill material 3 that extends off the gap in the peripheral portion of the wafer stack 23 be polished and removed by a polishing film. In this case, the semiconductor manufacturing apparatus 200 may be provided with a polishing head 600 for pressing the polishing film, and the polishing-removal may be performed in the semiconductor manufacturing apparatus 200. Alternatively, a commercially available bevel polishing unit (e.g., EAC200bi-T, EAC300bi-T by EBARA CORPORATION) using a polishing tape may be employed.

In such a manner, a structure shown in FIG. 2B can be obtained. Moreover, the second wafer 2 is used as grinding support, and the rear surface 1a of the first wafer 1 not connected with the second wafer 2 is grounded/polished. As thus described, the first wafer 1 having had a thickness of several hundreds micrometer is thinned so as to have a film thickness of the order of 50 μm, for example. As seen from FIG. 2C, with the gap being filled with the fill material 3, an angle of an edge 6 formed by the rear surface 1a of the first wafer 1 and a periphery-side end surface 7 of the fill material 3 is close to a right angle, and is not a knife edge (acute angle).

Figure 2D:
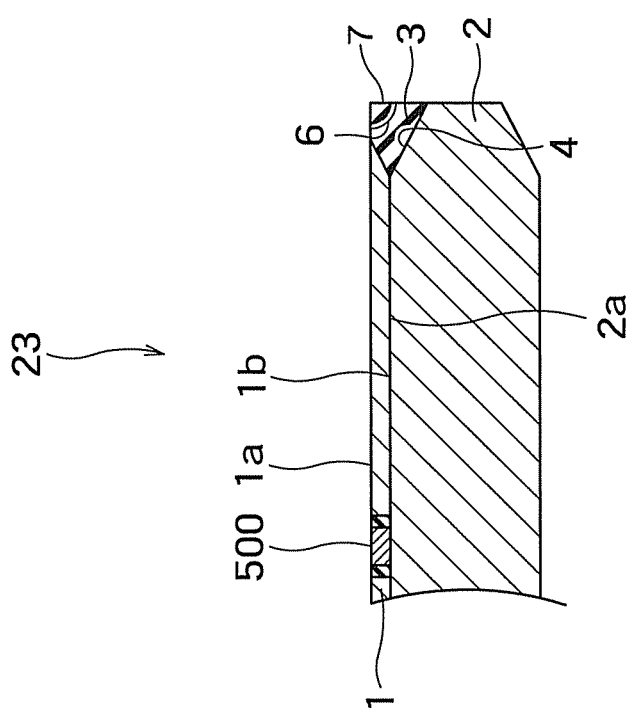

Subsequently, as shown in FIG. 2D, a third wafer 13 is stacked on the polished rear surface 1a of the first wafer 1. It is to be noted that the third wafer 13 can also be formed with a through electrode (not shown) in advance in a similar manner to the first wafer 1. Specifically, the first wafer 1 and the third wafer 13 are bonded to each other such that a front surface 13b of the third wafer 13 as a device surface formed with an electrode and the like and the rear surface 1a of the first wafer 1 are opposed to each other, and the centers and the notches of the third wafer 13 and the first wafer 1 are superimposed on each other.

Figure 2E:
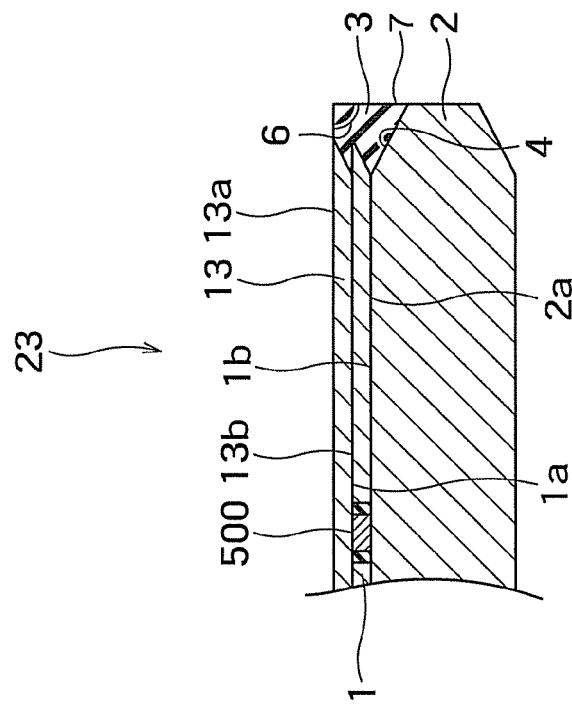
Figure 2F:
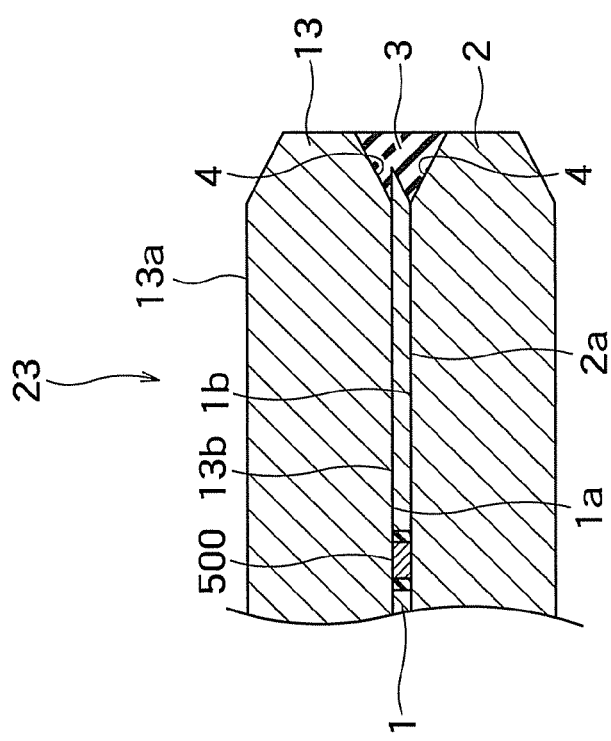

Then, as shown in FIG. 2E, a gap located between a bevel 4 of the third wafer 13 and the fill material 3 is further filled with the fill material 3 in a similar manner to what has been described above. Then as shown in FIG. 2F, a rear surface 13a of the third wafer 13 is grounded/polished. Also in this case, since the gap located between the bevel 4 of the third wafer 13 and the fill material 3 has further been filled with the fill material 3, an angle of an edge 6 formed by the rear surface 13a of the third wafer 13 and the end surface 7 of the fill material 3 is close to a right angle, and is not a knife edge.

Moreover, stacking of a wafer, further filling of a gap in the peripheral portion of the formed wafer stack 23 with the fill material 3 and grinding/polishing of the rear surface of the newly stacked wafer are repeated until the number of wafers becomes just a desired number. Hence it is possible to obtain the wafer stack 23 containing the desired number of wafers. Moreover, by individually separating this wafer stack 23, stacked modules can be obtained.

Next, the material for the fill material 3 will be described. The fill material 3 is preferably provided with characteristics and the like as below:

(1) having high adhesion to a film (e.g. silicon oxide film) located on the uppermost surface of each wafer;
(2) having mechanical resistance to grinding/polishing;
(3) having chemical resistance to a polishing solution and a cleaning solution for wafers;
(4) having thermal resistance to a high-temperature heat that is applied in a thermal process performed after bonding of wafers (e.g., preferably having thermal resistance to a heat of the order of 200° C.);)
(5) being cured and shrunk in a small degree;
(6) having a record of being used inside a clean room which is used in semiconductor device manufacturing;
(7) having a thermal expansion coefficient closer to that of a material for a wafer (e.g. silicon); and
(8) being not brittle (being elastic, if possible, so as to be able to disperse or alleviate stress).

Therefore, examples of the fill material 3 provided with the characteristics as described above may include materials mainly composed of a glass material, an inorganic polymer or an organic polymer. Specifically, the glass material is excellent in being resistant to heat. Examples of the material mainly composed of the glass material may include liquid glass, spin-on-glass, silane and silazane. Further, examples of the material mainly composed of a polymer may include thermal resistant synthetic resins, namely a fluorine resin, a silicon resin (silicone), a polyimide resin, a melamine resin and a benzocyclobutene resin. Moreover, a plastic-made composite resin (mixture of a photo-curable resin and a spherical filler), used as a tooth filling, may be used.

Furthermore, as the viscosity of the fill material 3, the optimal viscosity is selected so as to facilitate handling thereof. For example, an amount of the fill material 3 filling the gap located between the bevel 4 of the first wafer 1 and the bevel 4 of the second wafer 2 in the wafer stack 23 is approximately 0.024 $cm^3$ in the case of each wafer having a diameter of 300 mm. This filling amount is certainly a very small one. Under such circumstances, in order to facilitate rubbing of the fill material 3 into the gap without its flowing out of the gap, it is preferable that the viscosity of the fill material 3 be relatively high. Moreover, as described above, since the curing-shrinkage of the fill material 3 is relatively small, a proportion of a solvent component in the fill material 3 is preferably small.

According to the present embodiment, by filling the gap in the periphery of the wafer stack 23 with the fill material 3, the angle of the edge 6 formed by the rear surface 1a of the first wafer 1 after polishing and the end surface 7 of the fill material 3 becomes close to a right angle, and can thus avoid becoming a knife edge that causes chipping. Moreover, with the fill material 3 existing in the peripheral portion of the wafer stack 23, it is possible to avoid peeling of wafers off each other, so as to obtain the stable, tough wafer stack 23. Furthermore, with the chipping being preventable, it is possible to use semiconductor chips formed in the peripheral portion of each wafer or in the vicinity of the peripheral portion without wasting those chips, so as to increase the number of semiconductor chip usable from one wafer as compared with the manufacturing method having hitherto been considered by the present inventors. A specific description will be provided as follows.

As described above, the beveling process has been performed on the peripheral portion of the wafer. It has hitherto been known that, when such a wafer is not subjected to a further process and bonded to a support substrate to be grounded/polished, a pointy knife edge appears in the peripheral portion of the wafer. In this knife edge part, the wafer has a small thickness and is not in contact with the support substrate, thus having low strength. Hence chipping (cracking/cleavage) tends to occur in such a knife edge part.

Figure 6:
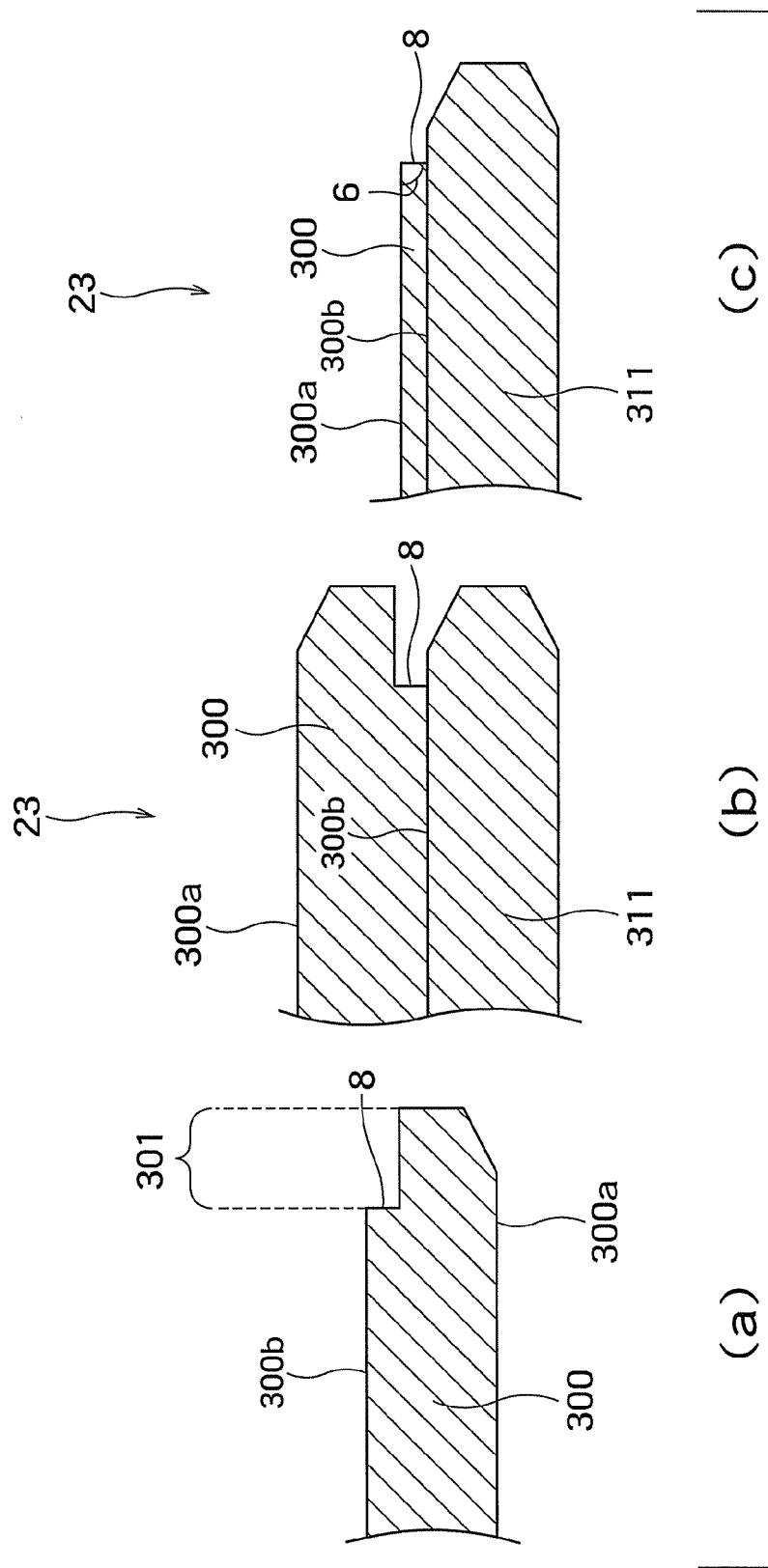
FIG. 6 is a view for explaining a semiconductor device manufacturing method of a comparative example.

Accordingly, the present inventors have considered an edge trimming method. The edge trimming method will be described using FIG. 6 as a comparative example of the present embodiment. FIGS. 6 (a) to 6 (c) are sectional views of a wafer 300, a peripheral portion 301 of the wafer stack 23 and its vicinity in respective processes of the edge trimming method. As shown in FIG. 6 (a), the peripheral portion 301 with a width of several millimeters on the front surface 300b of the wafer 300 is, for example, vertically dug down approximately 50 μm. A wall surface 8 formed by the digging-down becomes not a truncated conic side surface, but a cylindrical side surface. Next, as shown in FIG. 6 (b), the wafer 300 and a support substrate 311 are bonded to each other such that the front surface 300b of the wafer 300 comes into contact with the support substrate 311. Moreover, as shown in FIG. 6 (c), the wafer 300 is thinned by grinding/polishing its rear surface 300a. As also apparent from FIG. 6 (c), the edge 6 formed by the wall surface 8 and the rear surface 300a becomes almost a right angle after thinning of the wafer 300, and hence appearance of the knife edge can be avoided. However, there has been a problem with this method in that digging down the peripheral portion 301 causes reduction in a diameter of the wafer 300 from its periphery side, and a semiconductor chip formed in the peripheral portion 301 and the like of the wafer 300 cannot be used as a product, thus decreasing the number of semiconductor chips that can be acquired from one wafer. Further, there has been a problem in that the bonded wafers are peeled off in the peripheral portion 301.

However, according to the present embodiment, it is possible to avoid peeling of wafers off each other by filling the gap in the peripheral portion of the wafer stack 23 with the fill material 3, so as to obtain the stable, tough wafer stack 23. Moreover, with the peripheral portion 301 not being subjected to the digging-down process, it is possible to use semiconductor chips formed in the peripheral portion of each wafer or in the vicinity of the peripheral portion without wasting those chips.

Further, according to the present embodiment, the fill material 3 is used in the tape shape, and hence the fill material 3 can be handled in a fairly easy manner. Moreover, the viscosity and the like of the fill material 3 are set to the optimal values, whereby it is possible to make the curing time for the fill material 3 short, so as to suppress contamination of the wafer stack 23 by the fill material 3. Furthermore, the fill material-attached tape 24 is rubbed to perform filling with the fill material 3, whereby it is possible to make short the time taken for filling with the fill material 3, so as to avoid deterioration in manufacturing efficiency. Then, the gap is filled after the wafers have been stacked in advance, whereby it is possible to make an amount of the fill material 3 used small.

Second Embodiment

The present embodiment is different from the first embodiment in that the gap is filled with the fill material 3 by transferring or dropping the fill material 3 thereinto. Herein, a portion having the same configuration and function as in the first embodiment is provided with the same numeral, and a description thereof will be omitted.

Figure 7:
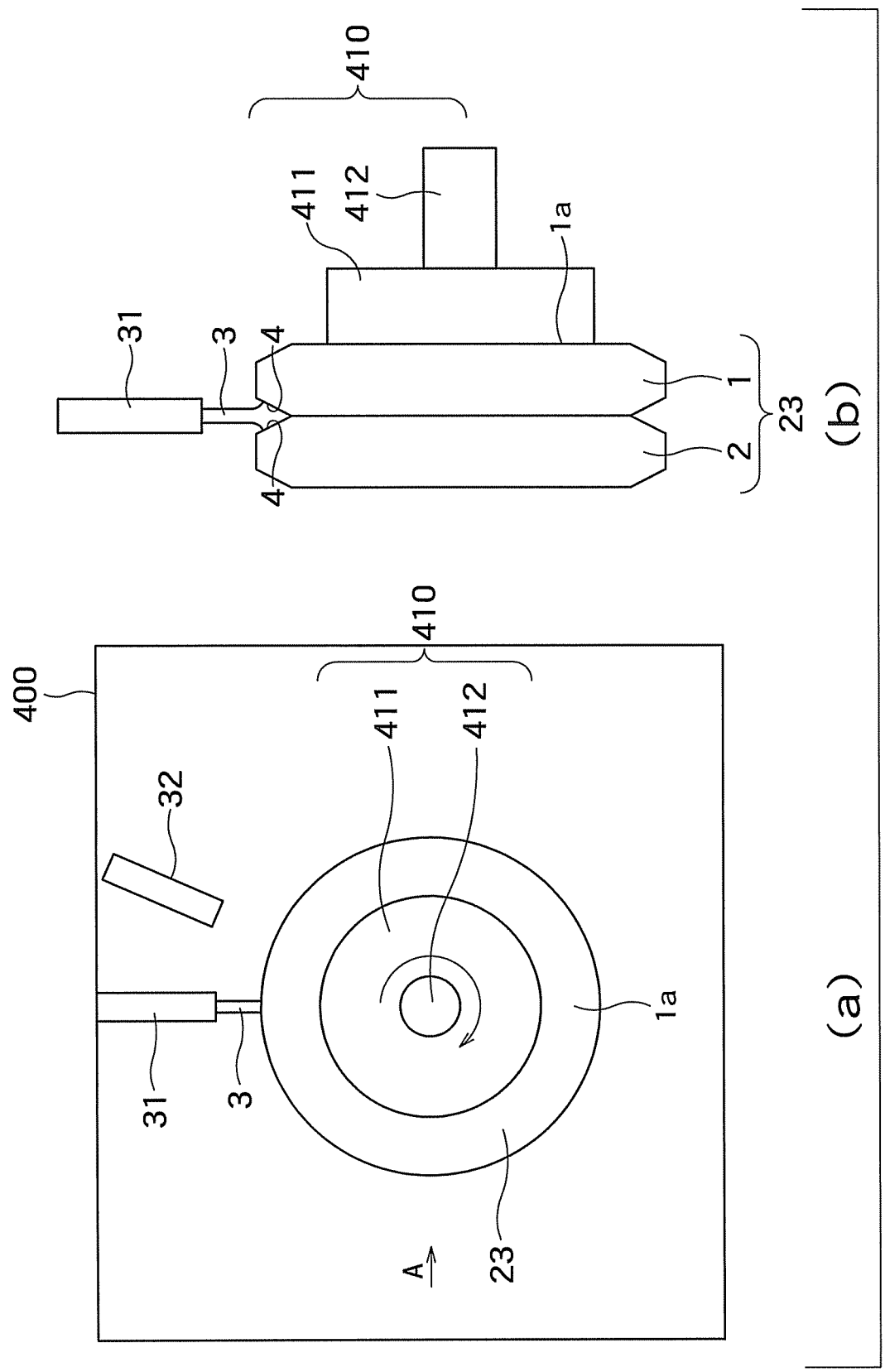
FIG. 7 is a view of a semiconductor manufacturing apparatus according to a second embodiment.

First, FIGS. 7 (a) and 7 (b) show a semiconductor manufacturing apparatus 400 used at the time of filling with the fill material 3. FIG. 7 (a) is a side view of the semiconductor manufacturing apparatus 400 mounted with the wafer stack 23, seen from the rear surface 1a side of the first wafer 1 in the wafer stack 23. FIG. 7 (b) is a view of the periphery of a holding portion (rotating unit) 410 of the semiconductor manufacturing apparatus 400, seen from an arrow A side shown in FIG. 7 (a). The semiconductor manufacturing apparatus 400 has the holding portion 410, a dispense nozzle (fill material supply unit) 31, and a light irradiation unit 32. The holding portion 410 has a holding table 411 that vacuum-adsorbs the surface of a wafer in the wafer stack 23 to hold the wafer stack 23, a support shaft 412 that supports the holding table 411, and a motor (not shown) for rotating the support shaft 412. For example, the holding table 411 rotates around the support shaft 412 as a rotating shaft, while the plane of the holding table 411 that holds the wafer stack 23 is kept in such a state as to be almost right-angled to the ground. The dispense nozzle 31 transfers or drops the fill material 3 into the gap located between the bevel 4 of the first wafer 1 and the bevel 4 of the second wafer 2 in the wafer stack 23. Moreover, the light irradiation unit 32 irradiates the fill material 3, transferred or dropped into the gap, with light and cure the fill material 3.

Figure 8:
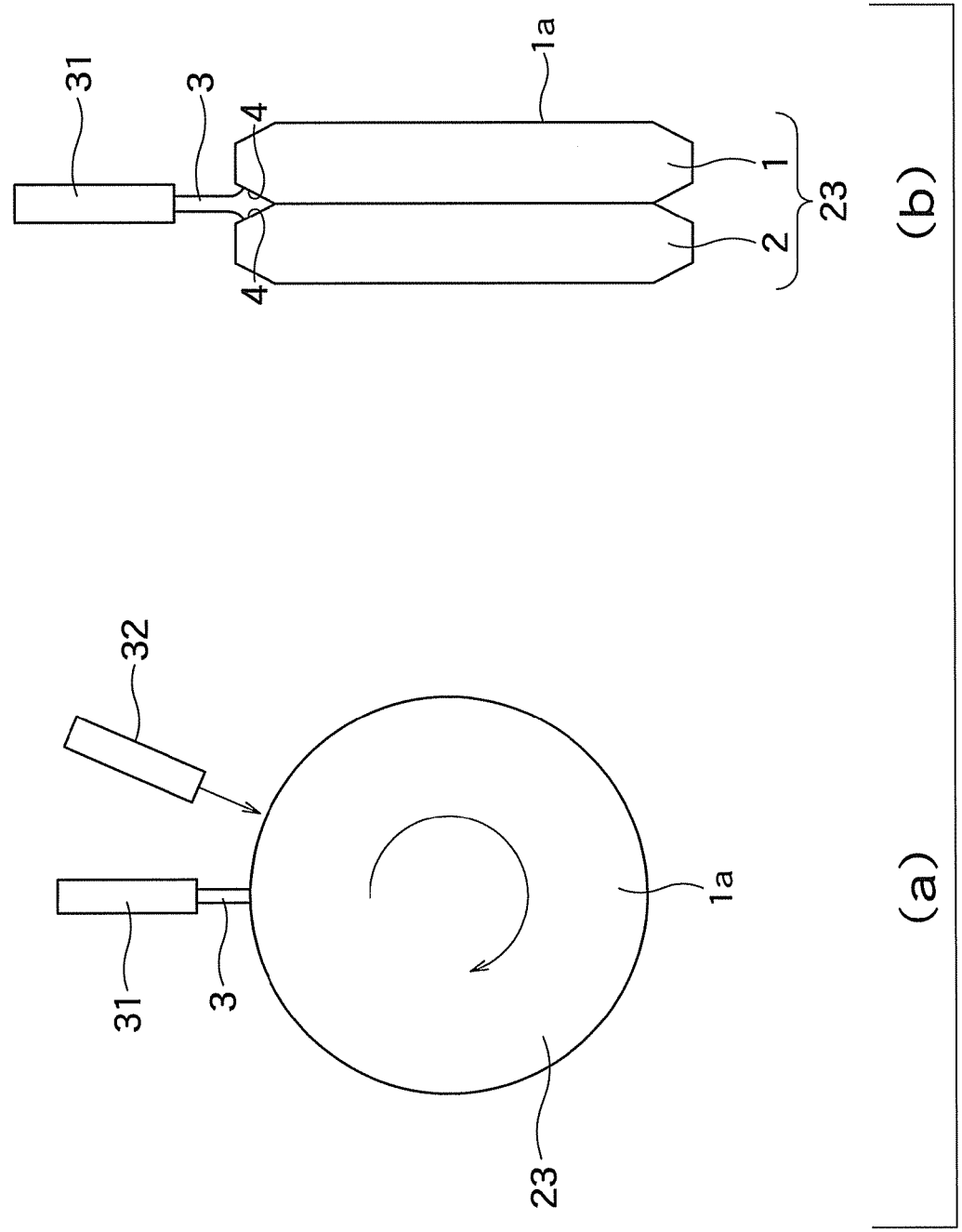
FIG. 8 is a view for explaining a semiconductor device manufacturing method according to the second embodiment.

Next, a manufacturing method of the present embodiment will be described using FIGS. 8 (a) and 8 (b). FIGS. 8 (a) and 8 (b) are views for explaining a process for filling with the fill material 3 in the manufacturing method of the present embodiment, and specifically, FIG. 8 (a) corresponds to FIG. 7 (a), and FIG. 8 (b) corresponds to FIG. 7 (b).

First, in a similar manner to the first embodiment, the first wafer 1 and the second wafer 2 are superimposed on each other, to form the wafer stack 23. Further, as shown in FIGS. 8 (a) and 8 (b), using the semiconductor manufacturing apparatus 400 as thus described, the wafer stack 23 is held on the holding table 411. At this time, the wafer stack 23 is arranged on the holding table 411 such that the center of each wafer is superimposed on the center of the support shaft 412 and that the surfaces (front surface and rear surface) of each wafer in the wafer stack 23 are almost right-angled to the ground. With this state being kept, the wafer stack 23 is rotated at the order of 1 rpm, for example. Then the fill material 3 is transferred or dropped into the gap in the peripheral portion of the wafer stack 23 by use of the dispense nozzle 31. Moreover, the fill material 3 immediately after being transferred or dropped into the gap is irradiated with light from the light irradiation unit 32, and the fill material 3 is thereby cured. It is preferable to select infrared rays as the light when the fill material 3 is a thermosetting resin, and select ultraviolet rays as the light when the fill material 3 is an ultraviolet curable resin. As thus described, by the fill material 3 being cured immediately after transferred or dropped, the gap can be filled with the fill material 3 without the fill material 3 dripping therefrom. It is to be noted that, although the fill material 3 according to the present embodiment can be selected from the materials used in the first embodiment, one is preferably selected which has such viscosity that the fill material 3 does not run from the gap and fills the gap.

In a similar manner to the first embodiment, after curing of the fill material 3, the residual fill material 3 that extends off the gap in the peripheral portion of the wafer stack 23 may be polished and removed. It should be noted that a description of a specific method for the polishing-removal will be omitted since it is similar to the first embodiment.

Then, the rear surface 1a of the first wafer 1 is grounded/polished in a similar manner to the first embodiment. Moreover, stacking of a wafer, filling with the fill material 3 and grinding/polishing of the wafer are repeated until the number of wafers becomes just a desired number, to eventually obtain the wafer stack 23 containing the desired number of wafers.

According to the present embodiment, it is possible to avoid the knife edge in a similar manner to the first embodiment by filling the gap, located between the bevels 4 of the stacked first wafer 1 and second wafer 2, with the fill material 3. Moreover, with the fill material 3 existing in the gap in the peripheral portion of the wafer stack 23, it is possible to avoid peeling of wafers off each other, so as to obtain the stable, tough wafer stack 23. Moreover, with the chipping being preventable, it is possible to use semiconductor chips formed in the peripheral portion of each wafer or in the vicinity of the peripheral portion without wasting those chips.

Furthermore, according to the present embodiment, the fill material 3 is cured immediately after being transferred or dropped into the gap, and hence the gap is filled with the fill material 3 without the fill material 3 dripped therefrom. Since the time taken for the filling with the fill material 3 is thus short, it is possible to prevent deterioration in manufacturing efficiency. Moreover, since the gap is filled after stacking of wafers in advance, the amount of the fill materials 3 can be made small.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor device manufacturing method, the method comprising:
    bonding a first wafer and a second wafer to each other, to form a stack;
    pressing a first film attached with a fill material in a thin-film shape against a gap located between a bevel of the first wafer and a bevel of the second wafer, to fill the gap with the fill material;
    removing residual fill material that extends off the gap by use of a second film after filling the gap with the fill material; and
    thinning the first wafer.

2. The semiconductor device manufacturing method according to claim 1, further comprising forming a through electrode in at least one wafer out of the first wafer and the second wafer before formation of the stack.

3. The semiconductor device manufacturing method according to claim 1, further comprising rotating the stack during at least one of the filling the gap with the fill material and the removing the residual material.

4. The semiconductor device manufacturing method according to claim 1, wherein a material containing a glass material, an inorganic polymer or an organic polymer is used as the fill material.

5. The semiconductor device manufacturing method according to claim 1, further comprising performing a treatment to cure the fill material after filling the gap with the fill material.

6. The semiconductor device manufacturing method according to claim 5, wherein the treatment to cure the fill material is a drying treatment, a heating treatment, or a light irradiation treatment.

* * * * *